(12) United States Patent
Woodyard (10) Patent No.: US 7,745,918 B1
(45) Date of Patent: Jun. 29, 2010

(54) PACKAGE IN PACKAGE (PIP)

(75) Inventor: Jon T. Woodyard, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 238 days.

(21) Appl. No.: 11/168,168

(22) Filed: Jun. 27, 2005

Related U.S. Application Data (60) Provisional application No. 60/630,775, filed on Nov. 24, 2004.

(51) Int. Cl.
*H01L 23/02* (2006.01)
(52) U.S. Cl. .............. 257/686; 257/778; 257/E25.006
(58) Field of Classification Search .............. 257/686, 257/777, 772, 779, E25.006, E25.013, E23.015, 257/698, 778
See application file for complete search history.

(56) References Cited

U.S. PATENT DOCUMENTS

| | | | |
|---|---|---|---|
| 6,838,761 B2 | 1/2005 | Karnezos | 257/685 |
| 6,861,288 B2 | 3/2005 | Shim et al. | 438/109 |
| 6,906,416 B2 | 6/2005 | Karnezos | 257/723 |
| 6,933,598 B2 | 8/2005 | Karnezos | 257/686 |
| 6,946,323 B1 | 9/2005 | Heo | 438/109 |
| 6,972,481 B2 | 12/2005 | Karnezos | 257/686 |
| 7,034,387 B2 | 4/2006 | Karnezos | 257/686 |
| 7,045,887 B2 | 5/2006 | Karnezos | 257/686 |
| 7,049,691 B2 | 5/2006 | Karnezos | 257/686 |
| 7,053,476 B2 | 5/2006 | Karnezos | 257/686 |
| 7,064,426 B2 | 6/2006 | Karnezos | 257/686 |
| 7,101,731 B2 | 9/2006 | Karnezos | 438/107 |
| 7,166,494 B2 | 1/2007 | Karnezos | 438/108 |
| 7,169,642 B2 | 1/2007 | Karnezos | 438/108 |
| 7,202,554 B1 | 4/2007 | Kim et al. | 257/686 |
| 7,205,647 B2 | 4/2007 | Karnezos | 257/686 |
| 7,208,821 B2 | 4/2007 | Ha et al. | 257/666 |
| 7,253,511 B2 | 8/2007 | Karnezos et al. | 257/686 |
| 7,309,913 B2 * | 12/2007 | Shim et al. | 257/686 |
| 2004/0056277 A1 | 3/2004 | Karnezos | 257/200 |
| 2004/0061212 A1 | 4/2004 | Karnezos | 257/686 |
| 2004/0061213 A1 | 4/2004 | Karnezos | 257/686 |
| 2004/0063242 A1 | 4/2004 | Karnezos | 438/106 |
| 2004/0063246 A1 | 4/2004 | Karnezos | 438/108 |
| 2004/0065963 A1 | 4/2004 | Karnezos | 257/777 |
| 2004/0113253 A1 | 6/2004 | Karnezos | 257/686 |
| 2004/0113254 A1 | 6/2004 | Karnezos | 257/686 |
| 2004/0113255 A1 | 6/2004 | Karnezos | 257/686 |
| 2004/0113275 A1 | 6/2004 | Karnezos | 257/758 |
| 2004/0119152 A1 | 6/2004 | Karnezos et al. | 257/686 |
| 2004/0119153 A1 | 6/2004 | Karnezos | 257/686 |
| 2004/0124518 A1 | 7/2004 | Karnezos | 257/686 |
| 2004/0195667 A1 | 10/2004 | Karnezos | 257/686 |
| 2004/0212066 A1 * | 10/2004 | Wang | 257/686 |
| 2005/0133916 A1 | 6/2005 | Karnezos | 257/738 |
| 2005/0224937 A1 * | 10/2005 | Lee | 257/678 |
| 2008/0122088 A1 * | 5/2008 | Todd et al. | 257/741 |

* cited by examiner

*Primary Examiner*—Hoa B Trinh
(74) *Attorney, Agent, or Firm*—Gunnison, McKay & Hodgson, L.L.P.; Serge J. Hodgson (57) ABSTRACT

A package includes an internal package stacked upon a primary die. The package includes interconnection balls to allow the package to be electrically and physically connected to a mother board. The package is mounted to the mother board in a single operation thus minimizing labor and the associated manufacturing cost. Further, the package is tested and verified to be non-defective prior to mounting to the mother board.

19 Claims, 7 Drawing Sheets

PACKAGE IN PACKAGE (PIP)

RELATED APPLICATIONS

This application claims the benefit of U.S. Provisional Application No. 60/630,775 filed on Nov. 24, 2004, entitled "PACKAGE IN PACKAGE (PiP)" of Jon T. Woodyard, which is incorporated herein by reference in its entirety.

BACKGROUND OF THE INVENTION

1. Field of the Invention

The present invention relates generally to the packaging of electronic components.

2. Description of the Related Art

To decrease the area required for mounting of electronic component packages to printed circuit boards, e.g., mother boards, electronic component packages are frequently stacked one upon another. However, stacking electronic component packages individually one upon another on the mother board is labor-intensive and thus significantly adds to the manufacturing cost. Further, after stacking of the electronic component packages, the stack of electronic component packages must be tested, e.g., for failure of the electrical connection, e.g., solder, between the stacked electronic component packages. In the event a failure is detected, the stack of electronic component packages must be reworked or the assembly discarded thus further adding to the manufacturing cost.

SUMMARY OF THE INVENTION

A package includes an internal package stacked upon a primary die. The package includes interconnection balls to allow the package to be electrically and physically connected to a mother board. The package is mounted to the mother board in a single operation thus minimizing labor and the associated manufacturing cost. Further, the package is tested and verified to be non-defective prior to mounting to the mother board.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

In accordance with one embodiment, a package 100 (FIG. 1) includes an internal package 130 stacked upon a primary die 104. Package 100 includes interconnection balls 118 to allow package 100 to be electrically and physically connected to a larger substrate, e.g., a printed circuit board, sometimes called a mother board. Thus, in contrast to stack mounting and electrically connecting a plurality of individual packages on the mother board, package 100 is mounted in a single operation thus minimizing labor and the associated manufacturing cost. Further, in one embodiment, package 100 is tested and verified to be non-defective prior to mounting to the mother board further minimizing manufacturing cost associated with reworking defective packages mounted to the mother board. Further, by mounting internal package 130 to a frontside surface 104F of primary die 104 using spacer 120, package 100 is extremely thin.

Figure 1:
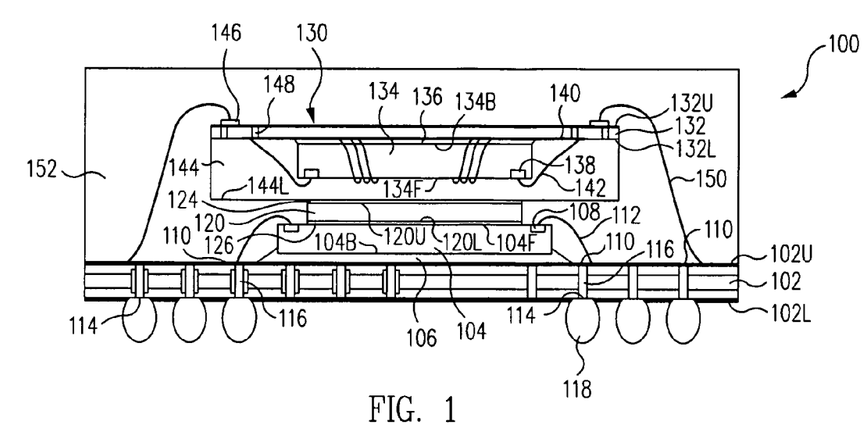
FIG. 1 is a cross-sectional view of a Chip Scale Package in Chip Scale Package (CSP-in-CSP) in accordance with one embodiment of the present invention.

More particularly, FIG. 1 is a cross-sectional view of a Chip Scale Package in Chip Scale Package 100 (CSP-in-CSP) in accordance with one embodiment of the present invention. Package 100 includes a primary substrate 102, such as, a laminate (resin-glass dielectric, two or more layers) or tape (polyimide or equivalent, one or more layers) substrate. A backside, e.g., first, surface 104B of a primary die 104, typically logic, however, other functions are possible, is attached to an upper, e.g., first, surface 102U of primary substrate 102, e.g., with a die attach adhesive 106.

Bond pads 108 on a frontside, e.g., second, surface 104F of primary die 104 are wire bonded, i.e., electrically connected, to first traces 110 on upper surface 102U of primary substrate 102 with primary wire bonds 112, sometimes called bond wires. First traces 110 are electrically connected to second traces 114, e.g., lands, on a lower, e.g., second, surface 102L of primary substrate 102 by electrically conductive vias 116 extending through primary substrate 102. Formed on second traces 114 are electrically conductive interconnection balls 118, e.g., solder balls. In various embodiments, package 100 is a Ball Grid Array (BGA) or land grid array (LGA) when interconnection balls 118 are not formed.

Attached to frontside surface 104F of primary die 104 inwards of bond pads 108 by an adhesive 126 is a spacer 120. Illustratively, spacer 120 includes silicon although other materials, e.g., polyimide, single homogeneous polymer adhesive, etc., are used in other embodiments. Spacer 120 includes upper and lower, e.g., first and second, surfaces 120U and 120L. Adhesives 124, 126 are attached to upper and lower surface 120U, 120L of spacer 120, respectively. Although one example of a spacer 120 and adhesives 124, 126 is set forth, in other embodiments, spacer 120 itself is adhesive tape or film, and/or epoxy, e.g., dispensed, such that separate adhesive 124, 126 are unnecessary and thus not used.

Spacer 120 spaces an internal package 130 apart from frontside surface 104F of primary die 104 and more particularly above the loop high of primary bond wires 112. Illustratively, internal package 130, typically memory, however, other functions are possible, is a pre-tested KGP.

Internal package 130, sometimes called an inverted or top package, includes an internal substrate 132, such as, a tape or laminate (polyimide or resin-glass dielectric respectively, one or more layers) or leadframe solid metal substrate. A backside surface 134B of an internal die 134 is attached to a lower, e.g., first, surface 132L of internal substrate 132, e.g., with a die attach adhesive 136.

Bond pads 138 on a frontside surface 134F of internal die 134 are wire bonded to first traces 140 on lower surface 132L of internal substrate 132 with internal wire bonds 142, sometimes called internal bond wires. Lower surface 132L of internal substrate 132, internal die 134, and internal wire bonds 142 are encapsulated in an internal encapsulant 144, sometimes called mold. A lower, e.g., first, surface 144L of internal encapsulant 144 is connected to upper surface 120U of spacer 120 by adhesive 124. As set forth above, spacer 120 spaces lower surface 144L of internal encapsulant 144 apart from frontside surface 104F of primary die 104 and more particularly above the loop high of primary bond wires 112. In accordance with this embodiment, lower surface 144L is parallel to a plane formed by upper surface 102U of primary substrate 102 and is also parallel to a plane formed by internal substrate 132. Although various elements may be described as parallel, it is to be understood that the elements may not be exactly parallel but only substantially parallel to within excepted manufacturing tolerances.

First traces 140 are electrically connected to second traces 146, e.g., lands, on an upper, e.g., second, surface 132U of internal substrate 132 by electrically conductive vias 148 extending through internal substrate 132.

Second traces 146 are electrically connected to first traces 110 of primary substrate 102 by secondary bond wires 150.

Upper surface 102U of primary substrate 102, primary die 104, primary bond wires 112, spacer 120, internal package 130, and secondary bond wires 150 are encapsulated in a primary encapsulant 152, sometimes called mold.

Package 100 enables memory sourcing of off-the-shelf memory packages solving issues tied to the memory market. Issues include the continuous shifts in market requirements, i.e., die shrinks, net list changes, large/diverse supply base, difficult to source wafers, limited/expensive Known Good Die (KGD) supply infrastructure. Package 100 enables a standardized net lists (supplier-to-supplier) of embedded memory and/or tested memory and individual package level for known good package (KGP) performance.

In accordance with one embodiment, interconnection balls 118 allow package 100 to be electrically and physically connected to a larger substrate, e.g., a printed circuit board, sometimes called a mother board. Thus, in contrast to stack mounting and electrically connecting a plurality of individual packages on the mother board, package 100 is mounted in a single operation thus minimizing labor and the associated manufacturing cost. Further, in one embodiment, package 100 is tested and verified to be non-defective prior to mounting to the mother board further minimizing manufacturing cost associated with reworking defective packages mounted to the mother board.

Figure 2:
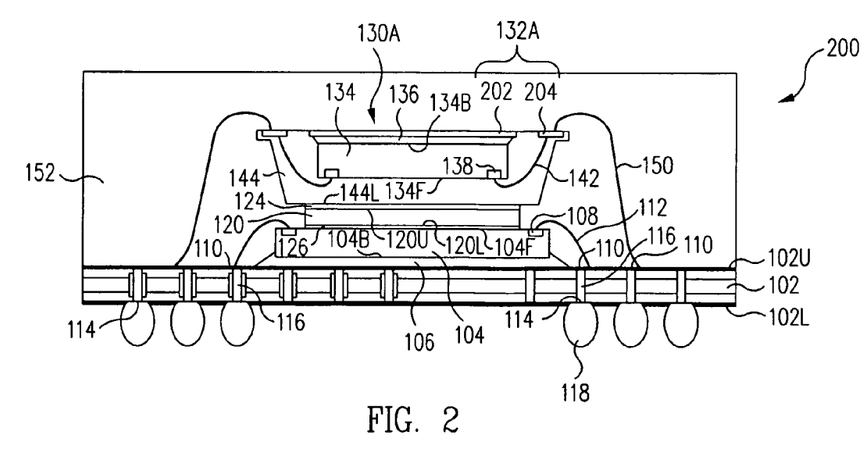
FIG. 2 is a cross-sectional view of a Quad Flat-package No-lead in Chip Scale Package (QFN-in-CSP) in accordance with one embodiment of the present invention.

FIG. 2 is a cross-sectional view of a Quad Flat-package No-lead in Chip Scale Package 200 (QFN-in-CSP) in accordance with one embodiment of the present invention. Package 200 of FIG. 2 is similar to package 100 of FIG. 1 and only the significant differences between packages 200 and 100 are discussed below. Referring now to FIG. 2, package 200 includes an internal package 130A comprising an internal leadframe substrate 132A. Internal leadframe substrate 132A include a die attach paddle 202 and leads 204.

Backside surface 134B of internal die 134 is attached to die attach paddle 202 by die attach adhesive 136. Bond pads 138 of internal die 134 are electrically connected to leads 204 by internal wire bonds 142.

Internal leadframe substrate 132A, internal die 134, and internal wire bonds 142 are encapsulated in an internal encapsulant 144 of internal package 130A. Internal encapsulant 144 only partially covers internal leadframe substrate 132A such that at least the upper surface of leads 204 is exposed. Leads 204 are electrically connected to first traces 110 of primary substrate 102 by secondary bond wires 150.

Upper surface 102U of primary substrate 102, primary die 104, primary bond wires 112, spacer 120, internal package 130A, and secondary bond wires 150 are encapsulated in primary encapsulant 152.

Package 200 can extend to encompass any leaded package using leadframe substrates such as SOP, QFP, SOIL, or other.

Figure 3:
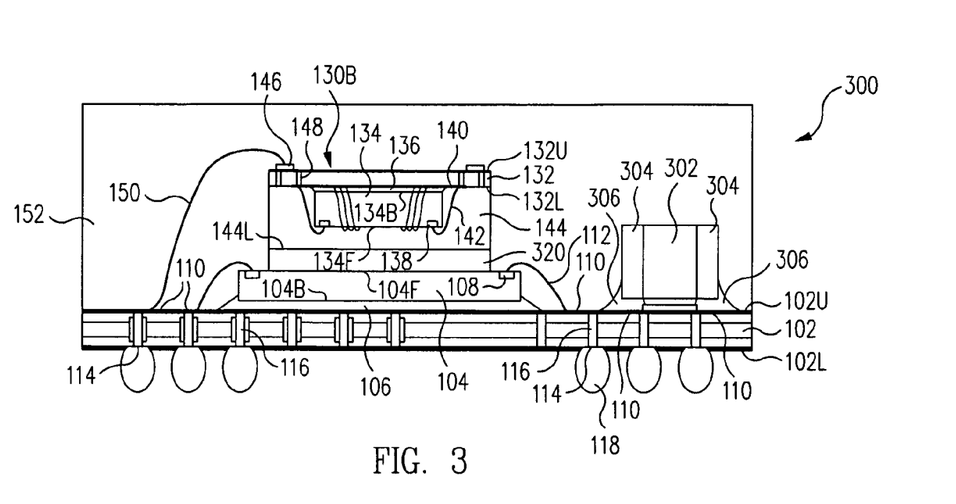
FIG. 3 is a cross-sectional view of a Chip Scale Package in System in Package (CSP-in-SiP) in accordance with one embodiment of the present invention.

FIG. 3 is a cross-sectional view of a Chip Scale Package in System in Package 300 (CSP-in-SiP) in accordance with one embodiment of the present invention. Package 300 of FIG. 3 is similar to package 100 of FIG. 1 and only the significant differences between packages 300 and 100 are discussed below.

Package 300 includes an internal package 130B similar to internal package 130 of FIG. 1 except that internal package 130B fits inwards of bond pads 108. In accordance with this embodiment, internal package 130B is not required to be spaced from primary die 104. Thus, lower surface 144L of internal encapsulant 144 is attached to frontside surface 104F of primary die 104 with adhesive 320. Illustratively, adhesive 320 is adhesive film or tape and/or a dispensed adhesive such as epoxy.

Further, package 300 includes an embedded passive device structure(s) 302, such as a resistor, capacitor, inductor, LTCC w/embedded capacitor, or other passive device, having terminals 304. Terminals 304 are electrically coupled, e.g., with solder joints 306 or other adhesive such as paste/epoxy with embedded conductive fillers, to first traces 110 of primary substrate 102. More generally, passive device structure(s) 302 is electrically and physically coupled to upper surface 102U of primary substrate 102. In one embodiment, passive device structure(s) 302 is another package such as a QFN or CSP package.

Upper surface 102U of primary substrate 102, primary die 104, primary bond wires 112, internal package 130B, secondary bond wires 150, and embedded passive device structure(s) 302 are encapsulated in primary encapsulant 152.

Figure 4:
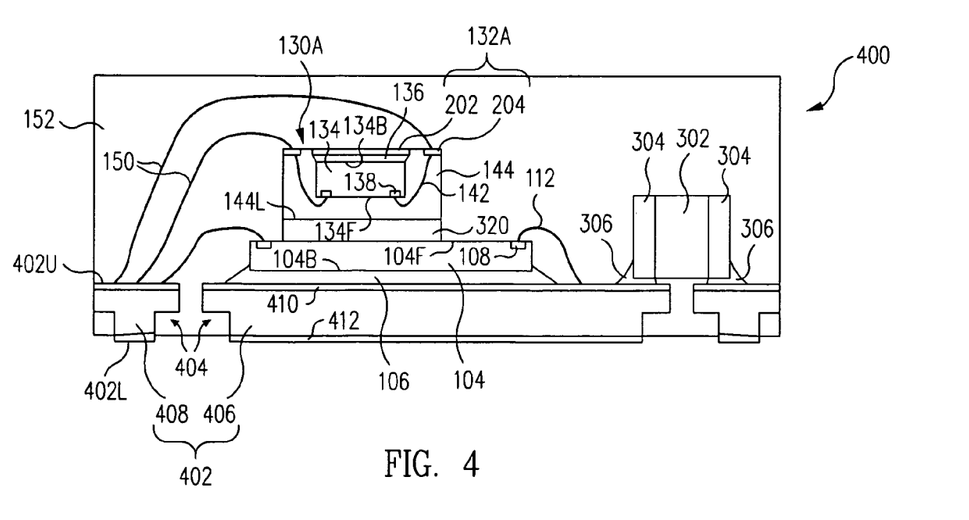
FIG. 4 is a cross-sectional view of a Quad Flat-package No-lead in Quad Flat-package No-lead/System in Package (QFN-in-QFN/SiP) in accordance with one embodiment of the present invention.

FIG. 4 is a cross-sectional view of a Quad Flat-package No-lead in Quad Flat-package No-lead/System in Package 400 (QFN-in-QFN/SiP) in accordance with one embodiment of the present invention.

Package 400 of FIG. 4 is similar to package 200 of FIG. 2 and only the significant differences between packages 400 and 200 are discussed below.

Package 400 includes an internal package 130A similar to internal package 130A of FIG. 2 except that internal package 130A fits inwards of bond pads 108. In accordance with this embodiment, internal package 130A is not required to be spaced from primary die 104. Thus, lower surface 144L of internal encapsulant 144 is attached to frontside surface 104F of primary die 104 with adhesive 320.

Package 400 includes a primary leadframe substrate 402, sometimes called a primary substrate, formed of an electrically conductive material such as copper. Primary leadframe substrate 402 includes an upper, e.g., first, surface 402U and a lower, e.g., second, surface 402L. In accordance with this embodiment, primary leadframe substrate 402 is formed with a protruding lip 404 at upper surface 402U such that lower surface 402L has a smaller total surface area than upper surface 402U as those of skill in the art will understand. Primary leadframe substrate 402 is sometimes called a half-etched leadframe substrate. Protruding lip 404 is embedded in primary encapsulant 152 preventing primary leadframe substrate 402 from being pulled out of or otherwise disengaged from primary encapsulant 152.

In accordance with this embodiment, primary leadframe substrate 402 includes a die attach paddle 406 and leads 408. Backside surface 104B of primary die 104 is attached to upper surface 402U of die attach paddle 406 of primary leadframe substrate 402, e.g., with a die attach adhesive 106.

Bond pads 108 on frontside surface 104F of primary die 104 are wire bonded, i.e., electrically connected, to die attach paddle 406 and/or leads 408 of primary leadframe substrate 402 with primary wire bonds 112. Further, leads 204 are electrically connected to die attach paddle 406 and/or leads 408 of primary leadframe substrate 402 by secondary bond wires 150.

In accordance with this embodiment, primary leadframe substrate 402 includes metallization layers 410, 412 on upper and lower surfaces 402U, 402L, respectively. Metallization layer 410, e.g., gold, enhances the bond between primary bond wires 112, secondary bond wires 150 and primary leadframe substrate 402. Further, metallization layer 412, e.g., gold, enhances the bondability with lower surface 402L, for example, the solder wetability with lower surface 402L. However, metallization layers 410, 412 are optional and in one embodiment are not formed.

Further, package 400 includes embedded passive device structure(s) 302 having terminals 304. Terminals 304 are electrically coupled, e.g., with solder joints 306 or other adhesive, to die attach paddle 406 and/or leads 408 of primary leadframe substrate 402. More generally, passive device structure(s) 302 is electrically and physically coupled to primary leadframe substrate 402.

Primary leadframe substrate 402, primary die 104, primary bond wires 112, internal package 130A, secondary bond wires 150, and embedded passive device structure(s) 302 are encapsulated in primary encapsulant 152. As discussed above, the lower surface of primary leadframe substrate 402 is not covered by primary encapsulant 152 and exposed.

Figure 5:
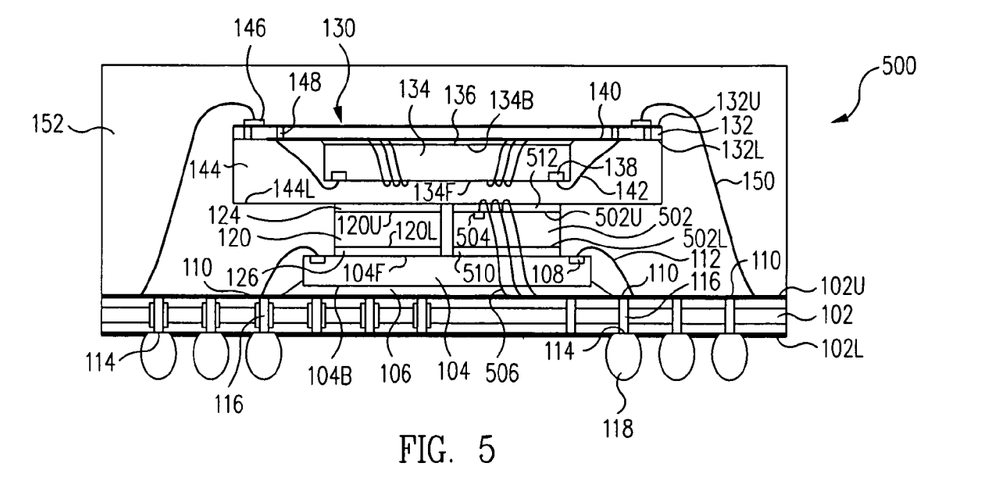
FIG. 5 is a cross-sectional view of a Chip Scale Package in Stacked Chip Scale Package (CSP-in-SCSP) in accordance with one embodiment of the present invention.

FIG. 5 is a cross-sectional view of a Chip Scale Package in Stacked Chip Scale Package 500 (CSP-in-SCSP) in accordance with one embodiment of the present invention. Package 500 of FIG. 5 is similar to package 100 of FIG. 1 and only the significant differences between packages 500 and 100 are discussed below.

Package 500 includes a third die 502 connected to frontside surface 104F of primary die 104. More particularly, a lower, e.g., first, surface 502L of third die 502 is connected to frontside surface 104F of primary die 104 with an adhesive 510. Further, a portion of an upper, e.g., second, surface 502U of third die 502 is connected to lower surface 144L of internal encapsulant 144 of internal package 130 by an adhesive 512. Third die 502 includes bond pads 504 on upper surface 502U.

Generally, only a central portion of upper surface 502U inwards of bond pads 504 is connected to lower surface 144L of internal encapsulant 144. Stated another way, bond pads 504 are not covered by internal package 130. In this manner, bond pads 504 are electrically connected to traces 110 by wire bonds 506.

Spacer 120 and third die 502 in combination space internal package 130 apart from frontside surface 104F of primary die 104 and more particularly above the loop high of primary bond wires 112.

Figure 6:
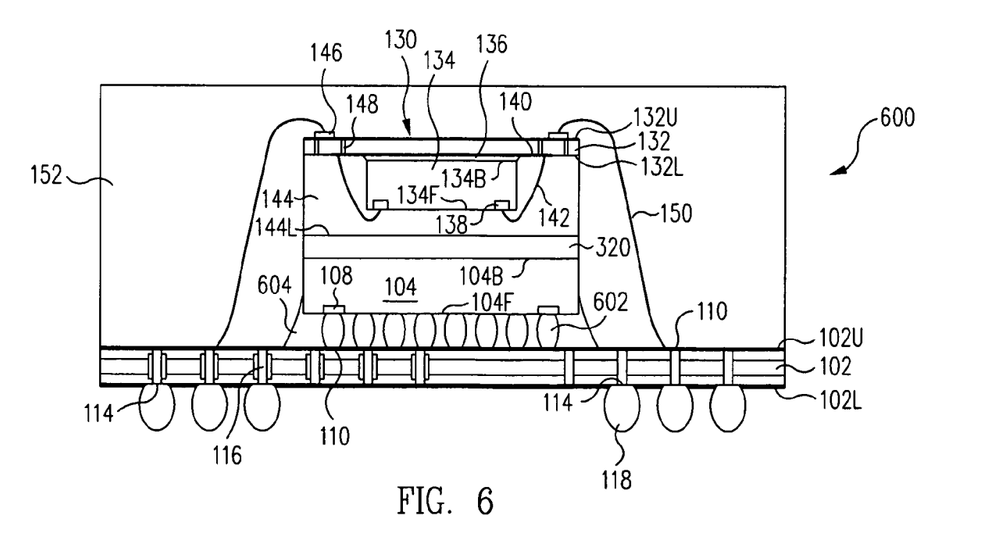
FIG. 6 is a cross-sectional view of a Chip Scale Package in flip chip Chip Scale Package (CSP-in-fcCSP) in accordance with one embodiment of the present invention.

FIG. 6 is a cross-sectional view of a Chip Scale Package in flip chip Chip Scale Package 600 (CSP-in-fcCSP) in accordance with one embodiment of the present invention. Package 600 of FIG. 6 is similar to package 100 of FIG. 1 and only the significant differences between packages 600 and 100 are discussed below.

In accordance with this embodiment, primary die 104 is flip chip mounted to primary substrate 102. More particularly, bond pads 108 are electrically and physically connected to first traces 110 by flip chip bumps 602, e.g., solder. An underfill 604 fills the space between frontside surface 104F of primary die 104 and upper surface 102U of primary substrate 102 and encloses flip chip bumps 602. However, underfill 604 is optional and in one embodiment is not formed such that primary encapsulant 152 fills the space between frontside surface 104F of primary die 104 and upper surface 102U of primary substrate 102 and encloses flip chip bumps 602.

In accordance with this embodiment, adhesive 320 is connected to backside surface 104B of primary die 104. More particularly, backside surface 104B of primary die 104 is connected to lower surface 144L of internal encapsulant 144 by adhesive 320.

Figure 7:
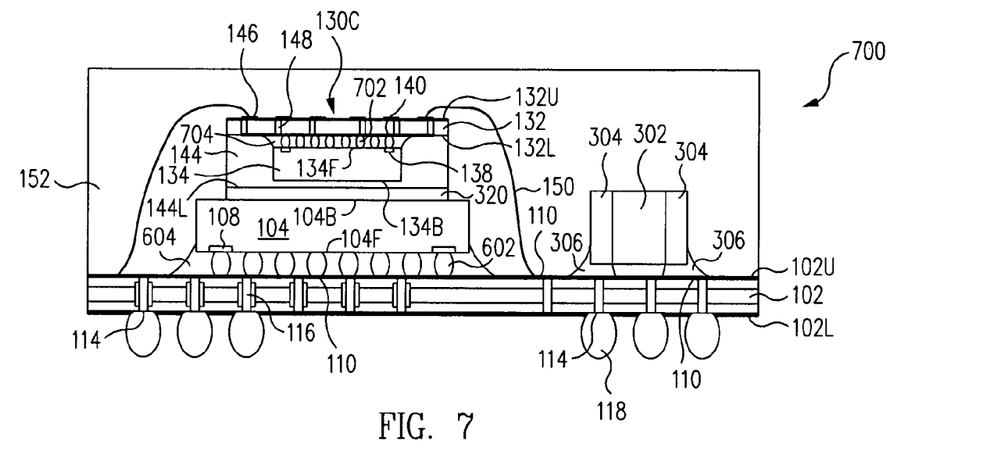
FIG. 7 is a cross-sectional view of a (Wafer Scale package or Flip Chip package) in flip chip System in Package ((Wafer Scale or FC)-in-fcSiP) in accordance with one embodiment of the present invention.

FIG. 7 is a cross-sectional view of a (Wafer Scale package or Flip Chip package) in flip chip System in Package 700 ((Wafer Scale or FC)-in-fcSiP) in accordance with one embodiment of the present invention. Package 700 of FIG. 7 is similar to package 600 of FIG. 6 and only the significant differences between packages 700 and 600 are discussed below.

In accordance with this embodiment, internal die 134 of an internal package 130C is flip chip mounted to internal substrate 132. More particularly, bond pads 138 are electrically and physically connected to first traces 140 by flip chip bumps 702. An underfill 704 fills the space between frontside surface 134F of internal die 134 and lower surface 132L of internal substrate 132 and encloses flip chip bumps 702. However, underfill 704 is optional and in one embodiment is not formed such that internal encapsulant 144 fills the space between frontside surface 134F of internal die 134 and lower surface 132L of internal substrate 132 and encloses flip chip bumps 702.

Further, package 700 includes embedded passive device structure(s) 302 having terminals 304. Terminals 304 are electrically coupled, e.g., with solder joints 306 or other adhesive, to first traces 110 of primary substrate 102. More generally, passive device structure(s) 302 is electrically and physically coupled to upper surface 102U of primary substrate 102.

Figure 8:
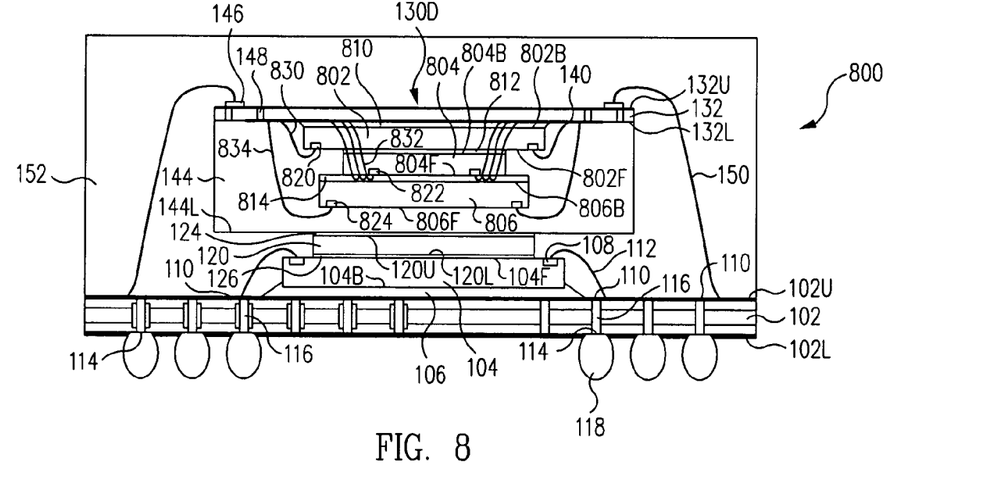
FIG. 8 is a cross-sectional view of a Stacked Chip Scale Package in Chip Scale Package (SCSP-in-CSP) in accordance with one embodiment of the present invention.

FIG. 8 is a cross-sectional view of a Stacked Chip Scale Package in Chip Scale Package 800 (SCSP-in-CSP) in accordance with one embodiment of the present invention. Package 800 of FIG. 8 is similar to package 100 of FIG. 1 and only the significant differences between packages 800 and 100 are discussed below.

In accordance with this embodiment, an internal package 130D includes a first internal die 802, a second internal die 804 stacked on internal die 802, and a third internal die 806 stacked on second internal die 804. More particularly, internal die 802 includes a frontside surface 802F and a backside surface 802B, internal die 804 includes a frontside surface 804F and a backside surface 804B, and internal die 806 includes a frontside surface 806F and a backside surface 806B. Internal dies 802, 804, 806 include bond pads 820, 822, and 824 on frontside surfaces 802F, 804F, 806F, respectively.

Backside surface 802B of internal die 802 is mounted to lower surface 132L of internal substrate 132 by an adhesive 810. Backside surface 804B of internal die 804 is mounted to a portion of frontside surface 802F of internal die 802 by an adhesive 812. Generally, only a central portion of frontside surface 802F inwards of bond pads 820 is connected to backside surface 804B of internal die 804. Stated another way, bond pads 820 are not covered by internal die 804. In this manner, bond pads 820 are electrically connected to first traces 140 by first internal wire bonds 830.

Backside surface 806B of internal die 806 is mounted to a portion of frontside surface 804F of internal die 804 by an adhesive 814. Generally, only a central portion of frontside surface 804F inwards of bond pads 822 is connected to backside surface 806B of internal die 806. Stated another way, bond pads 822 are not covered by internal die 806. In this manner, bond pads 822 are electrically connected to first traces 140 by second internal wire bonds 832. Further, bond pads 824 are electrically connected to first traces 140 by third internal wire bonds 834. Generally, bond pads 820, 822, 824 of internal dies 802, 804, 806 are wire bonded to first traces 140 of internal substrate 132 and/or are wire bonded to each other.

Lower surface 132L of internal substrate 132, internal dies 802, 804, 806, and internal wire bonds 830, 832, 834 are encapsulated in internal encapsulant 144.

Figure 9:
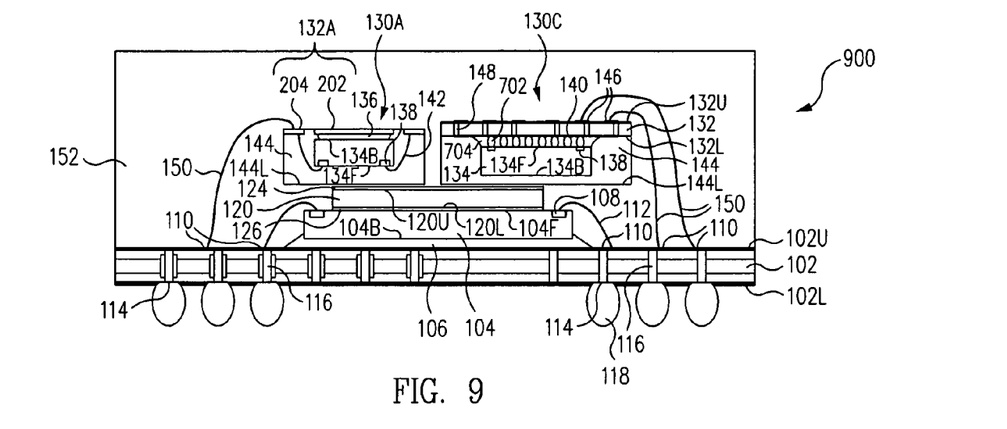
FIG. 9 is a cross-sectional view of a Quad Flat-package No-lead and Flip Chip package in Chip Scale Package (QFN&FC-in-CSP) in accordance with one embodiment of the present invention.

FIG. 9 is a cross-sectional view of a Quad Flat-package No-lead and Flip Chip package in Chip Scale Package 900 (QFN&FC-in-CSP) in accordance with one embodiment of the present invention. Package 900 of FIG. 9 is similar to package 200 of FIG. 2 and only the significant differences between packages 900 and 200 are discussed below.

In accordance with this embodiment, package 900 includes a first internal package 130A similar to internal package 130A of FIG. 2 and a second internal package 130C similar to internal package 130C of FIG. 7. Lower surfaces 144L of internal encapsulants 144 of internal packages 130A, 130C are connected to upper surface 120U of spacer 120 by adhesive 124.

Figure 10:
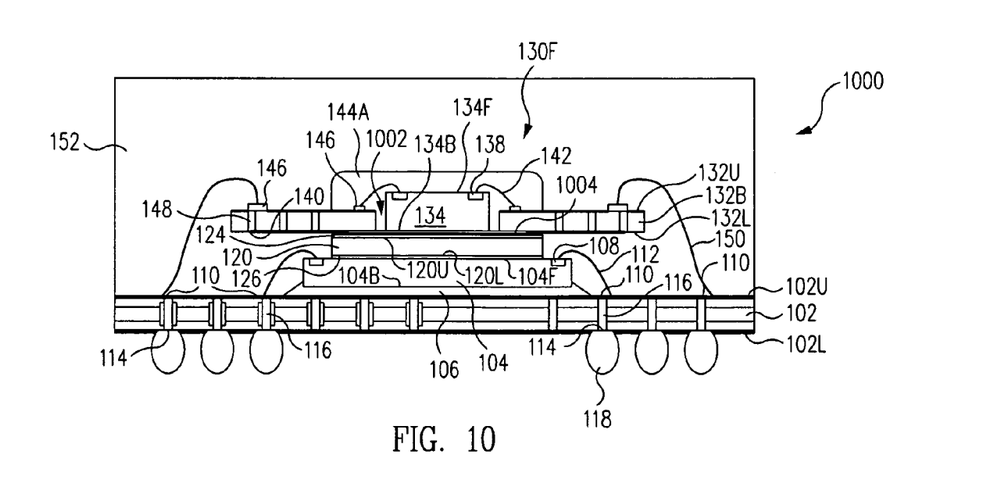
FIG. 10 is a cross-sectional view of a Package Stackable Chip Scale Package including extremely thin Chip Scale Package in Chip Scale Package (PS-CSP-in-CSP) in accordance with one embodiment of the present invention.

FIG. 10 is a cross-sectional view of a Package Stackable Chip Scale Package including extremely thin Chip Scale Package in Chip Scale Package 1000 (PS-CSP-in-CSP) in accordance with one embodiment of the present invention. Package 1000 of FIG. 10 is similar to package 100 of FIG. 1 and only the significant differences between packages 1000 and 100 are discussed below.

In accordance with this embodiment, package 1000 includes an internal package 130E having an internal substrate 132B with a hole 1002 located therein. More particularly, hole 1002 extends between an upper surface 132U and a lower surface 132L of internal substrate 132B. A sealing sheet 1004 is coupled to lower surface 132L and covers hole 1002 at lower surface 132L. However, sealing sheet 1004 is optional and in one embodiment is not used.

Internal die 134 is located within hole 1002 such that backside surface 134B is in contact with sealing sheet 1004 and generally is parallel to lower surface 132L of internal substrate 132B. In one embodiment, internal die 134 does not directly contact internal substrate 132B.

Bond pads 138 are wire bonded to upper traces 146 of internal substrate 132B by internal wire bonds 142. Further, upper traces 146 are wire bonded to upper traces 110 of primary substrate 102 by secondary bond wires 150.

Internal die 134, internal wire bonds 142, hole 1002, and a portion of upper surface 132U of internal substrate 132B are encapsulated in an internal encapsulant 144A.

Internal substrate 132B further includes lower traces 140 electrically connected to upper traces 146 by vias 148. However, in another embodiment, internal substrate 132B does not include lower traces 140 and/or vias 148.

The lower surface 132L of internal substrate 132B is connected to spacer 120 by adhesive 124. Spacer 120 spaces lower surface 132L of internal substrate 132B apart from frontside surface 104F of primary die 104 and more particularly above the loop high of primary bond wires 112.

Figure 11:
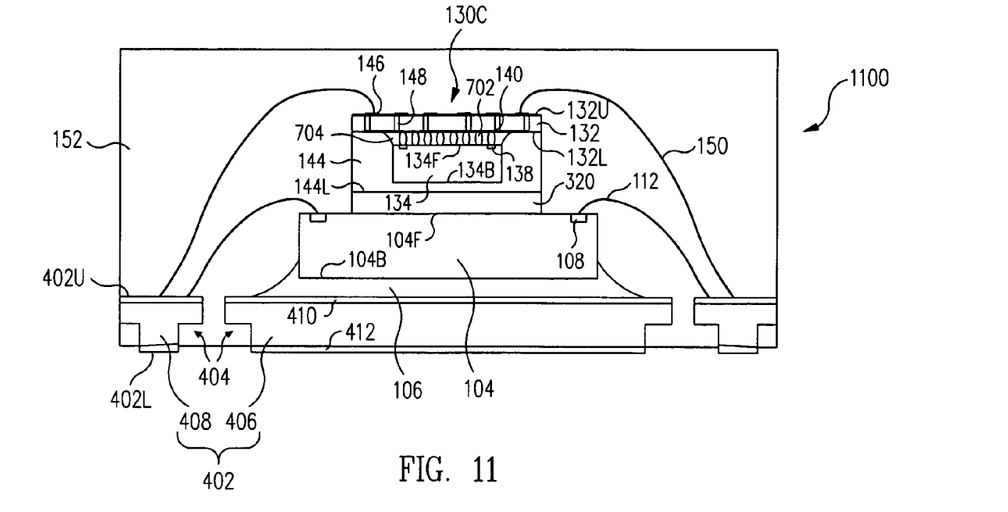
FIG. 11 is a cross-sectional view of a Wafer Scale or Flip Chip package in Quad Flat-package No-lead package (WS or FC-in-QFN) in accordance with one embodiment of the present invention.

FIG. 11 is a cross-sectional view of a Wafer Scale or Flip Chip package in Quad Flat-package No-lead package 1100 (WS or FC-in-QFN) in accordance with one embodiment of the present invention. Package 1100 of FIG. 11 is similar to package 400 of FIG. 4 and only the significant differences between packages 1100 and 400 are discussed below.

In accordance with this embodiment, package 1100 is formed with internal package 130C of FIG. 7 in place of internal package 130A of FIG. 4. Further, package 1100 is formed without an embedded passive device structure(s) 302 as compared to package 400 of FIG. 4. However, in another embodiment, package 1100 includes an embedded passive device structure(s) 302. Generally, any of packages 100-1300 of FIGS. 1-13 can be formed with or without embedded passive device structure(s) 302.

Figure 12:
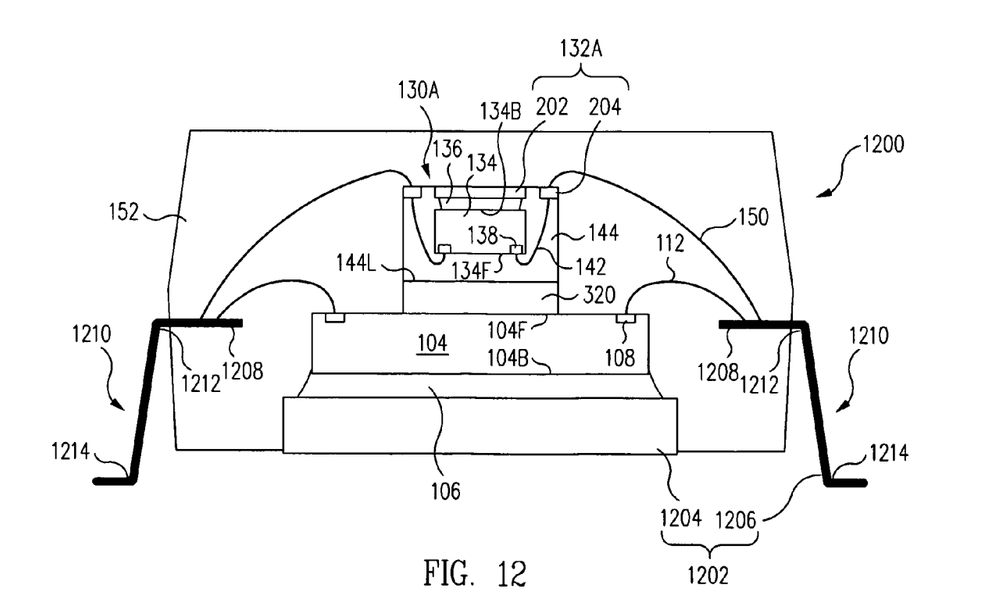
FIG. 12 is a cross-sectional view of a Quad Flat-package No-lead in Leaded Package (QFN-in-Leaded Pkg) in accordance with one embodiment of the present invention.

FIG. 12 is a cross-sectional view of a Quad Flat-package No-lead in Leaded Package 1200 (QFN-in-Leaded Pkg) in accordance with one embodiment of the present invention. Package 1200 of FIG. 12 is similar to package 400 of FIG. 4 and only the significant differences between package 1200 and package 400 are discussed below.

In accordance with this embodiment, package 1200 includes a leadframe 1202. Primary die 104 is attached to a die attach paddle 1204 of leadframe 1202 and wirebonded to leads 1206 of leadframe 1202.

More particularly, backside surface 104B of primary die 104 is attached to die attach paddle 1204 by adhesive 106. Bond pads 108 are electrically connected to leads 1206 by primary wire bonds 112. Further, leads 204 of internal leadframe substrate 132A of internal package 130A are electrically connected to leads 1206 by secondary bond wires 150.

Die attach paddle 1204, primary die 104, internal package 130A, primary wire bonds 112, secondary wire bonds 150, and the inner ends 1208 of leads 1206 are encapsulated in a primary encapsulant 152. The outer ends 1210 of leads 1206 extend downwards and outwards from primary encapsulant 152. More particularly, leads 1206 include downward bends 1212 and opposite outward bends 1214.

Figure 13:
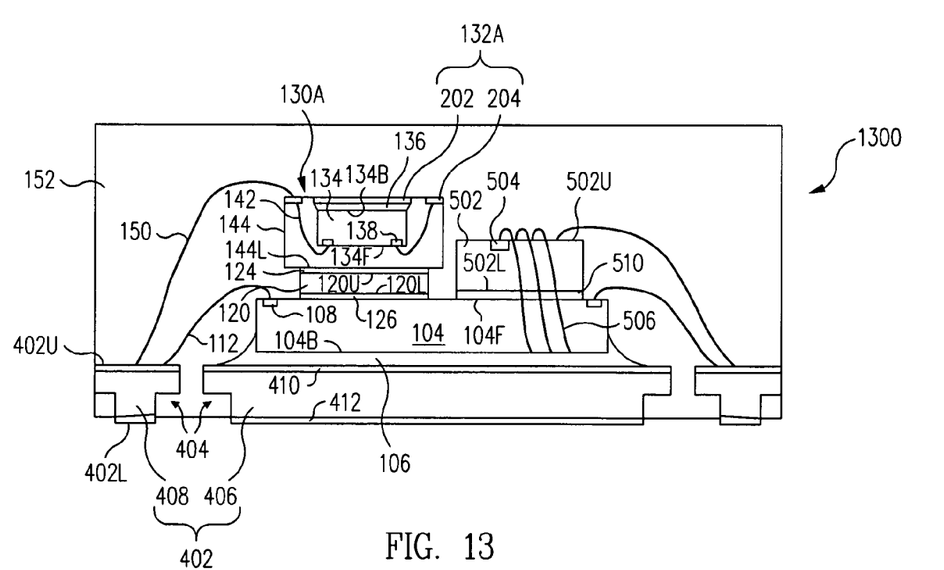
FIG. 13 is a cross-sectional view of a Quad Flat-package No-lead in Stacked Quad Flat-package No-lead (QFN-in-SQFN) in accordance with one embodiment of the present invention.

FIG. 13 is a cross-sectional view of a Quad Flat-package No-lead in Stacked Quad Flat-package No-lead 1300 (QFN-in-SQFN) in accordance with one embodiment of the present invention. Package 1300 of FIG. 13 is similar to package 400 of FIG. 4 and only the significant differences between packages 1300 and 400 are discussed below.

Package 1300 includes third die 502 connected to frontside surface 104F of primary die 104. More particularly, backside surface 502L of third die 502 is connected to frontside surface 104F of primary die 104 by adhesive 510. Bondpads 504 of a frontside surface 502U of third die 502 are electrically connected to die attach paddle 406 and/or leads 408 of primary leadframe substrate 402 with wire bonds 506.

Referring again to FIG. 1, in accordance with one embodiment, a method of fabricating package 100 includes forming internal package 130. Illustratively, internal package 130 is formed by attaching internal die 134 to internal substrate 132. Bond pads 138 are electrically connected to lower traces 140 by internal wire bonds 142. Lower surface 132L of internal substrate 132, internal die 134, and wire bonds 142 are encapsulated in encapsulant 144.

Primary die 104 is attached to primary substrate 102 with adhesive 106. Bond pads 108 are electrically connected to first traces 110 by wire bonds 112. Internal package 130 is attached to primary die 104 by spacer 120, e.g., a combination of dielectric silicon, polyimide, etc. and/or an adhesive structure(s). Upper traces 146 of internal package 130 are electrically connected to first traces 110 of primary substrate 102 by secondary bond wires 150. Upper surface 102U of primary substrate 102, primary die 104, spacer 120, internal package 130, wire bonds 112, 150 are encapsulated in primary encapsulant 152.

In one embodiment, a plurality of internal packages 130 are formed simultaneously in an array and singulated to form individual internal packages 130. Further, in one embodiment, a plurality of packages 100 are formed simultaneously in an array and singulated to form individual packages 100.

The other packages are formed in a similar manner and so only significant differences are discussed below.

For example, in packages 300, 400 of FIGS. 3, 4, embedded passive device structure(s) 302 are typically surface mounted to primary substrate 102 by reflowing solder to form solder joints 306 or with paste/epoxy with embedded conductive fillers prior to or at the same time as die attachment of primary die 104. The internal packages 130B, 130A are mounted to primary die 104 using adhesive 320.

In package 500 of FIG. 5, third die 502 is attached to primary die 104 prior to mounting of internal package 130.

In package 600 of FIG. 6, primary die 104 is flip chip mounted to primary substrate 102 by reflowing solder to form flip chip bumps 602. Underfill 604 is then applied to enclose flip chip bumps 602. In one embodiment, underfill 604 is not formed. For example, a vacuum molding process is used to pull primary encapsulant 152 between primary die 104 and substrate 102 and to enclose flip chip bumps 602.

In package 700 of FIG. 7, internal die 134 is flip chip mounted to internal substrate 132 by reflowing solder to form flip chip bumps 702. Optionally, underfill 704 is then applied to enclose flip chip bumps 702. Further, in one embodiment, embedded passive device structure(s) 302 are surface mounted simultaneously with the flip chip mounting of primary die 104 in a single reflow operation.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A structure comprising:
   a primary substrate comprising a first surface and a second surface;
   a primary die attached to the first surface;
   primary bond wires electrically connecting bond pads on a frontside surface of the primary die to first traces on the first surface of the primary substrate;
   an internal package comprising:
      an internal substrate comprising a first surface and a second surface;
      an internal die attached to the first surface of the internal substrate; and
   an adhesive attaching the internal package to the frontside surface of the primary die, wherein the width of the internal package is less than the width between the bond pads on the frontside surface of the primary die such that the internal package entirely fits inward of the bond pads.

2. The structure of claim 1 further comprising:
   second traces on the second surface of the primary substrate, the second traces electrically connected to the first traces.

3. The structure of claim 2 further comprising interconnection balls on the second traces.

4. The structure of claim 1 wherein the internal package further comprises:
   internal bond wires electrically connecting bond pads on a frontside surface of the internal die to first traces on the first surface of the internal substrate.

5. The structure of claim 4 wherein the internal package further comprises an internal encapsulant encapsulating the first surface of the internal substrate, the internal die, and the internal bond wires.

6. The structure of claim 5 wherein a first surface of the internal encapsulant is connected to the adhesive.

7. The structure of claim 4 wherein the internal package further comprises second traces electrically coupled to the first traces of the internal package.

8. The structure of claim 7 wherein the second traces of the internal package are electrically connected to the first traces of the primary substrate by secondary bond wires.

9. The structure of claim 8 wherein the first surface of the primary substrate, the primary die, the primary bond wires, the adhesive, the internal package, and the secondary bond wires are encapsulated in a primary encapsulant.

10. The structure of claim 1 further comprising a third die connected to the frontside surface of the primary die.

11. The structure of claim 1 wherein the internal die is a first internal die, the internal package further comprising:
    a second internal die mounted on the first internal die; and
    a third internal die mounted on the second internal die.

12. The structure of claim 1 wherein the
    internal die is flip chip mounted to the internal substrate.

13. The structure of claim 1 wherein the
    internal substrate comprises a hole; and
    the internal die is located within the hole.

14. The structure of claim 1 wherein the primary substrate comprises a primary leadframe substrate.

15. A structure comprising:
a primary substrate;
a primary die attached to the primary substrate;
primary bond wires electrically connecting bond pads on a frontside surface of the primary die to first traces of the primary substrate;
an internal package comprising:
 an internal substrate comprising a first surface and a second surface; and
 an internal die attached to the first surface of the internal substrate,
wherein the internal package is mounted to the frontside surface of the primary die by an adhesive, wherein the width of the internal package is less than the width between the bond pads on the frontside surface of the primary die such that the internal package does not extend beyond the bond pads on the frontside surface of the primary die; and
secondary bond wires electrically connecting the internal package to the primary substrate.

16. A structure comprising:
a primary substrate comprising a first surface and a second surface;
a primary die attached to the first surface;
primary bond wires electrically connecting bond pads on a frontside surface of the primary die to first traces on the first surface of the primary substrate;
an internal package comprising:
 an internal substrate comprising a first surface and a second surface;
 an internal die attached to the first surface of the internal substrate;
 internal bond wires electrically connecting bond pads on a frontside surface of the internal die to first traces on the first surface of the internal substrate; and
 second traces electrically coupled to the first traces of the internal package;
an adhesive connected to the frontside surface of the primary die only inward of the bond pads of the primary die and the internal package, wherein the width of the internal package is less than the width between the bond pads on the frontside surface of the primary die such that the internal package entirely fits inward of the bond pads on the frontside surface of the primary die;
secondary bond wires electrically connecting the second traces of the internal package to the first traces of the primary substrate; and
second traces on the second surface of the primary substrate, the second traces electrically connected to the first traces of the primary substrate.

17. The structure of claim 16 further comprising interconnection balls on the second traces of the primary substrate.

18. The structure of claim 1 further comprising a passive device structure coupled to the first surface of the primary substrate.

19. The structure of claim 18 wherein the passive device structure comprises terminals electrically connected to the first traces.

* * * * *